(12) United States Patent
Satoh et al.

(10) Patent No.: US 6,708,318 B2
(45) Date of Patent: Mar. 16, 2004

(54) WIRING RESISTANCE CORRECTING METHOD

(75) Inventors: Kazuhiro Satoh, Osaka (JP); Fumihiro Kimura, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/963,563

(22) Filed: Sep. 27, 2001

(65) Prior Publication Data

US 2002/0056073 A1 May 9, 2002

(30) Foreign Application Priority Data

Sep. 27, 2000 (JP) .......................... 2000-294376

(51) Int. Cl.[7] ............................................. G06F 17/50
(52) U.S. Cl. ...................... 716/5; 716/4; 716/2; 716/1
(58) Field of Search ........................................ 716/1–14

(56) References Cited

U.S. PATENT DOCUMENTS

| | | | |
|---|---|---|---|
| 6,100,177 A | * 8/2000 | Noguchi | 438/620 |
| 6,182,269 B1 | 1/2001 | Laubhan | 716/5 |
| 6,185,722 B1 | 2/2001 | Darden et al. | 716/5 |
| 6,219,631 B1 | 4/2001 | Oh et al. | 703/14 |
| 6,429,114 B1 | * 8/2002 | Hayama et al. | 438/616 |
| 2001/0027553 A1 | * 10/2001 | Tanaka et al. | 716/2 |
| 2001/0034595 A1 | * 10/2001 | Yamaguchi | 703/19 |

FOREIGN PATENT DOCUMENTS

| | | |
|---|---|---|
| JP | 9-55433 | 2/1997 |
| JP | 2000-3912 | 1/2000 |

* cited by examiner

Primary Examiner—Matthew Smith
Assistant Examiner—Sun James Lin
(74) Attorney, Agent, or Firm—McDermott, Will & Emery

(57) ABSTRACT

Where there are wirings with different film thicknesses or a sheet resistance in a non-scraped state of a wiring layer cannot be obtained as a result of the CPM technique, a wiring resistance according to a film thickness when an LSI is manufactured is acquired by automatic processing to reduce its difference from a real resistance, and accurate voltage drop analysis is carried out to reduce malfunction in a real chip. In a semiconductor circuit device with a plurality of kinds of film thicknesses in the same wiring layer, with a variation occurring in the wiring film thickness when wirings are formed on a silicon wafer, or a warp occurring in an upper layer because the stacking of lower layers is not uniform in the manufacturing process of the wiring, an error of the wiring resistance due to the difference in the film thickness or warp of the wiring is corrected to produce a virtual layout data.

9 Claims, 7 Drawing Sheets

302
301

WIRING RESISTANCE CORRECTING METHOD

BACKGROUND OF THE INVENTION

1. Field of the Invention

This invention relates to a wiring resistance correcting method, and more particularly to a designing method which corrects algorism-wisely an error between a resistance value on a mask CAD and a resistance value on a real chip in simulation processing at the occasion of designing a semiconductor integrated circuit, thereby increasing the accuracy in timing analysis and voltage drop analysis so as to improve the yield without causing malfunction due to undervoltage.

2. Description of the Related Art

In a conventional semiconductor designing method, circuit designing and layout designing are carried out on a computer to create mask information, and mask processing is carried out by using the data, thereby manufacturing a semiconductor device.

Where the semiconductor device is actually manufactured, the following process is adopted. First, a capacitance and resistance value of a wiring are taken out from the mask information data after layout designing considering a wiring length, wiring width and wiring distance. Simulation of delay computing and voltage drop is carried out using the data thus taken out. The simulation result is fed back to take measures before the mask processing. The technique for increasing the yield by taking the measures before the mask processing has been well known.

In this designing flow, as seen from FIG. 10, each wiring resistance information 102 is taken out from a layout data 101 and the value is used, as it is, as an input with no correction to voltage drop analysis processing 103. Assuming that the film is constant within the same wiring and the wiring layer is located on a horizontal plane with no warp, with a wiring resistance being given to each wiring layer with a parameter of a sheet resistance, the layout data 101 on the conventional mask CAD is generally acquired by a two-dimensional function of a wiring length and a wiring width.

However, in the manufacturing process for the semiconductor device, the wiring shape on the mask data and that on a real chip are different due to the material, width, distance, arrangement state of the wiring/insulating film. As a countermeasure for the error due to light diffraction among the errors between the mask data and the real data, an OPC (Optical Proximity Correction) technique is generally known. As a countermeasure for occurrence of a change in the film thickness, various flattening techniques have been adopted. There is also a problem in the flattening processing. Particularly, a CMP (Chemical/Mechanical Polishing) technique presents problems of scraping of a wiring layer and reduction in a film. As a countermeasure for this, as disclosed in JP-A-2000-3912, there has been proposed a technique for controlling an etching speed and preventing scraping of the wiring layer in a manner of coating an upper layer of the wiring layer with a film having a low etching speed.

As regards the voltage drop analysis technique, processing for analyzing whether or not the voltage satisfies an operable voltage range (e.g. JP-A-9-55433) has been generally adopted.

However, there is a problem that it difficult to manufacture a device with a shape with complete coincidence by the processing of approximating the mask data and the shape on the real chip according to a conventional technique. Where the wiring width is large, it is also difficult to suppress the scraping of the wiring layer by the method of fixing the scraping of the wiring layer and insulating film layer in the CMP technique. Where there: are changes in the thickness of the wiring layer and insulating film layer, as the size of the multi-layer wiring structure increases, a warp occurs in the wiring of the upper layer according to the wiring shape of the lower layer. It is further difficult to suppress the warp. Where there is a change in the wiring film thickness or a warp of the wiring on the actual mask data, if the voltage drop is acquired on the basis of the two-dimensional data on the mask CAD tool as in the prior art, the capacitance and resistance on the tool are different from those of the actual chip. Likewise, the voltage drop differs between the result by simulation and that on the real chip. In this case, although the LSI has been operated at the time of simulating, the corresponding actual chip malfunctions, thereby decreasing the production yield.

SUMMARY OF THE INVENTION

This invention has been accomplished in view of the above circumstance, and intends to provide a designing technique which computes a change between the resistance on a real chip and that in simulation, thereby making it possible to detect the problem on the real chip with the aid of the simulation.

In order to attain the above object, in a method of designing a semiconductor integrated circuit having a wiring on the surface of a semiconductor substrate, a wiring resistance correcting method according to this invention is characterized by comprising: a wiring resistance correcting step of correcting a resistance of the wiring according to film thickness information.

In the second aspect of this invention, the semiconductor substrate is a silicon wafer, and the wiring is a metallic wiring for connecting terminals of transistors arranged on the silicon wafer, the wiring resistance correcting step correcting the resistance of the metallic wiring according to the film thickness information.

The third aspect of this invention is characterized in that the wiring resistance correcting step comprises the steps of:

acquiring a varying function by computing a variation from a designed value of the wiring film thickness in manufacturing an LSI;

computing a wiring film thickness on a real chip formed from the semiconductor substrate on the basis of the varying function; and correcting a layout data which is designed value information of the wiring film thickness on the basis of a difference between the designed value of the wiring film thickness and its value on the real chip.

The fourth aspect of this invention is characterized in that the wiring resistance correcting step comprises the steps of:

computing a wiring width so that the resistance of the wiring becomes a specified resistance, and changing a layout data to provide the wiring width thus computed.

The fifth aspect of this invention is characterized in that the wiring resistance correcting step comprises the steps:

computing a change in a wiring length of an upper layer on the basis of a stacking state of a lower layer in a multiplayer wiring for forming an LSI by stacking a wiring layer and an insulating film layer, and correcting the resistance into a resistance corresponding to the wiring length thus computed.

In such a configuration, the data of the resistance outputted from the mask CAD tool can be corrected to a value more approximate to the resistance when the LSI is actually manufactured, simulation such as delayed value analysis, voltage drop analysis, etc. can be effected with great accuracy.

Specifically, for example, the data of the resistance outputted from the mask CAD tool is corrected considering a change in the resistance when the LSI is manufactured. Where it is difficult to create previously the information for considering a change in the resistance when the LSI is manufactured, the above information is produced through automatic computation.

The mask CAD tool accesses the same data base with the one which is accessed by a tool for simulation. In order to deal with the case where it is difficult to correct the actual resistance of each wiring, parameters in the data base is modified to change the virtual wirings and layout in accordance with the corrected resistance.

Further, in order to consider the warp of the wiring on the upper layer due to changes in the wiring shape in the lower layer, the wiring length of the upper layer is computed on the basis of the stacking state of the lower layer.

DESCRPITION OF THE PREFERRED EMBODIMENTS

Figure 1:
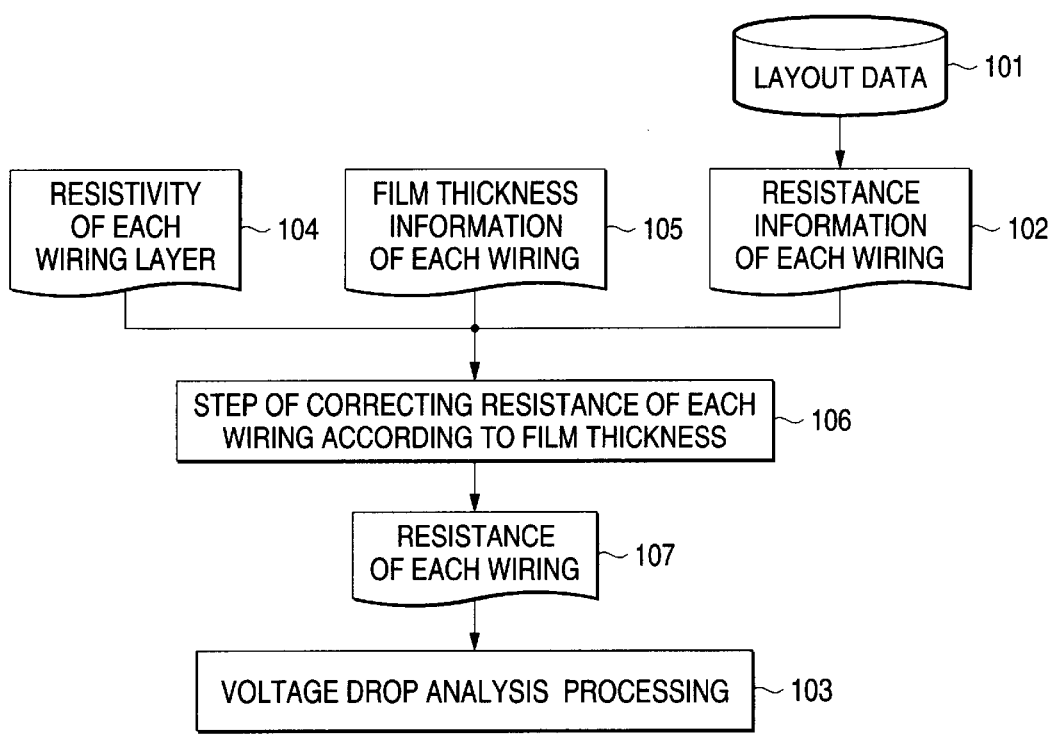
FIG. 1 is an implementing flowchart of a first embodiment of this invention.

Now referring to the drawings, a detailed explanation will be given of embodiments of this invention. Incidentally, as regards the steps explained in connection with the prior art, the explanation will not be repeated.

Figure 5:
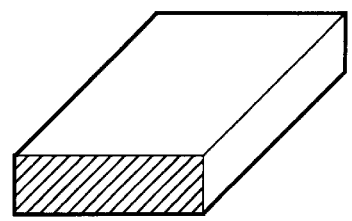
FIG. 5 is a sectional view of wiring shapes with different film thicknesses according to the first embodiment.
Figure 5:
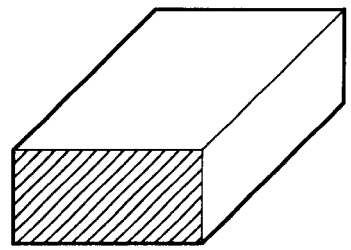
Figure 5:
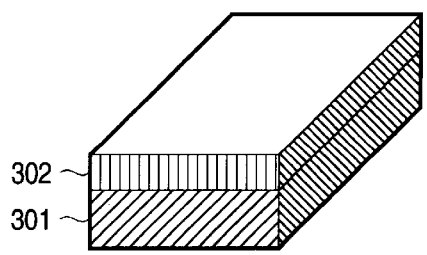
Figure 6:
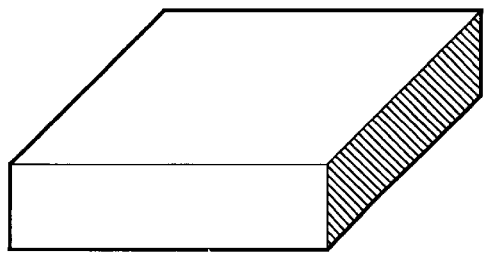
FIG. 6 is a sectional view of a wiring shape with a scraped wiring according to the second embodiment.
Figure 6:
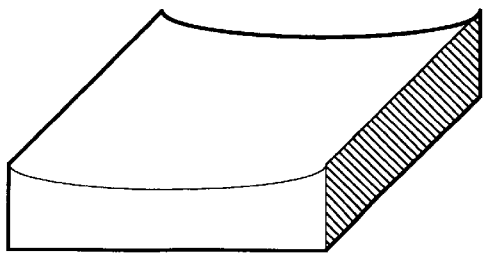
Figure 7:
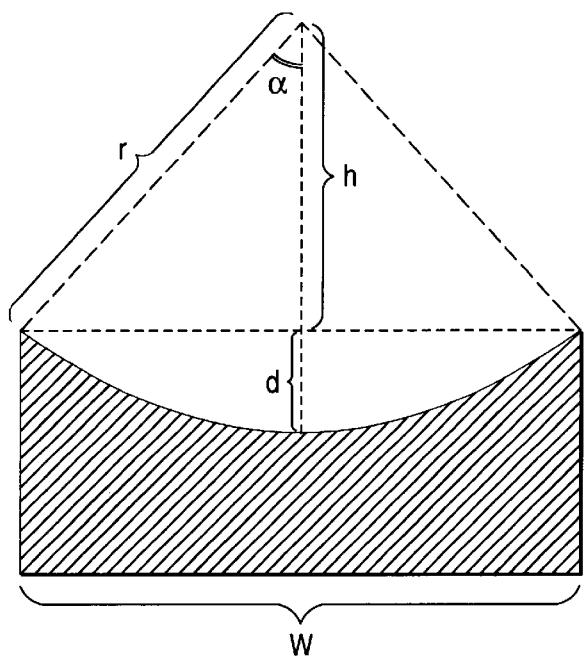
FIG. 7 is a view for explaining a scraping function according to the second embodiment.

FIG. 1 is a flowchart showing airing resistance correcting method according to an embodiment of this invention. FIGS. 5 and 6 are sectional views of a semiconductor device according to an embodiment of this invention. FIG. 7 is a view for explaining a scraping function of the semiconductor device according to an embodiment of this invention.

The first method of this invention, as seen from FIG. 1, is characterized by comprising the steps of reading layout information from a layout data 101, computing the resistance information of each wiring in a resistance information computing step 102, computing resistivity information from a file 104 on which the resistivity of each wiring layer is described, taking out film thickness information in a step 105 for computing the film thickness of each wiring, correcting the wiring resistance according to the film thickness using the resistance information, film thickness and resistivity information of each wiring in step 106, computing the resistance of each wiring through the correction in step 107, and analyzing a voltage drop on the basis of the resistance information of each wiring thus corrected in step 103.

An explanation will be given of the operation of a method of correcting the wiring resistance according to an embodiment of this invention.

First, like a conventional technique, in FIG. 1, resistance information of each wiring, e.g. SPF file outputted as well as wiring capacitance information is computed from a layout data 101 (for example, data base and mask data format GDSII on the layout tool available from various tool venders). The wiring resistance information acquired in the wiring resistance information computing step 102 has a signal name of the wiring and resistance information of each segment.

Using, as an input a parameter file on which the resistance information and the resistivity of each wiring layer are described and the file 105 on which the film thickness information of each wiring is described, in the wiring resistance correcting step 106, the wiring resistance for each wiring is corrected to the resistance corresponding to the film thickness. The film thickness information acquired in the film thickness information computing step describes the predicted varying information of the film thickness for each wiring where the film thickness is varied optionally or where the varying quantity is predicted. For example, the wiring resistance correcting step 106 is executed using e.g. an equation of the resistance information acquired in the resistance information computing step 102 multiplied by a normal film thickness/corrected film thickness.

Assuming that the normal film thickness of the wiring shown in FIG. 5($a$) is H1, the corrected film thickness of the wiring shown in FIG. 5($b$) is H2 and the wiring resistance shown in FIG. 5($a$) is R, as regards the corrected film thickness H2, the resistance of the wiring shown in FIG. 5($b$) is represented by R×H1/H2. Although the corrected film thickness H2 was used, the contents of the file specified as the film thickness information 105 may not be the film thickness itself, but the ratio of the film thickness represented in the form of H1/H2.

Where the wiring film thickness is varied using the layer of a different material as shown in FIG. 5($c$) in order to form a wiring layer having a different thickness as shown in FIG. 5($b$), the resistivity 104 of each wiring layer is added to the equation to compute the resistance corresponding to the film thickness of each wiring layer and the resistance is computed in a manner of adding a parallel resistance.

For example, in FIG. 5($c$), assuming that the resistance of a lower portion 301 is H1 and the resistance of an upper portion 302 is H3, the resistance of the wiring of FIG. 5($c$) is represented by H1×H2/(H1+H2).

By performing the analysis processing such as voltage drop analysis using the corrected resistance, the accurate analysis result more approximate to the actual LSI can be acquired.

Figure 2:
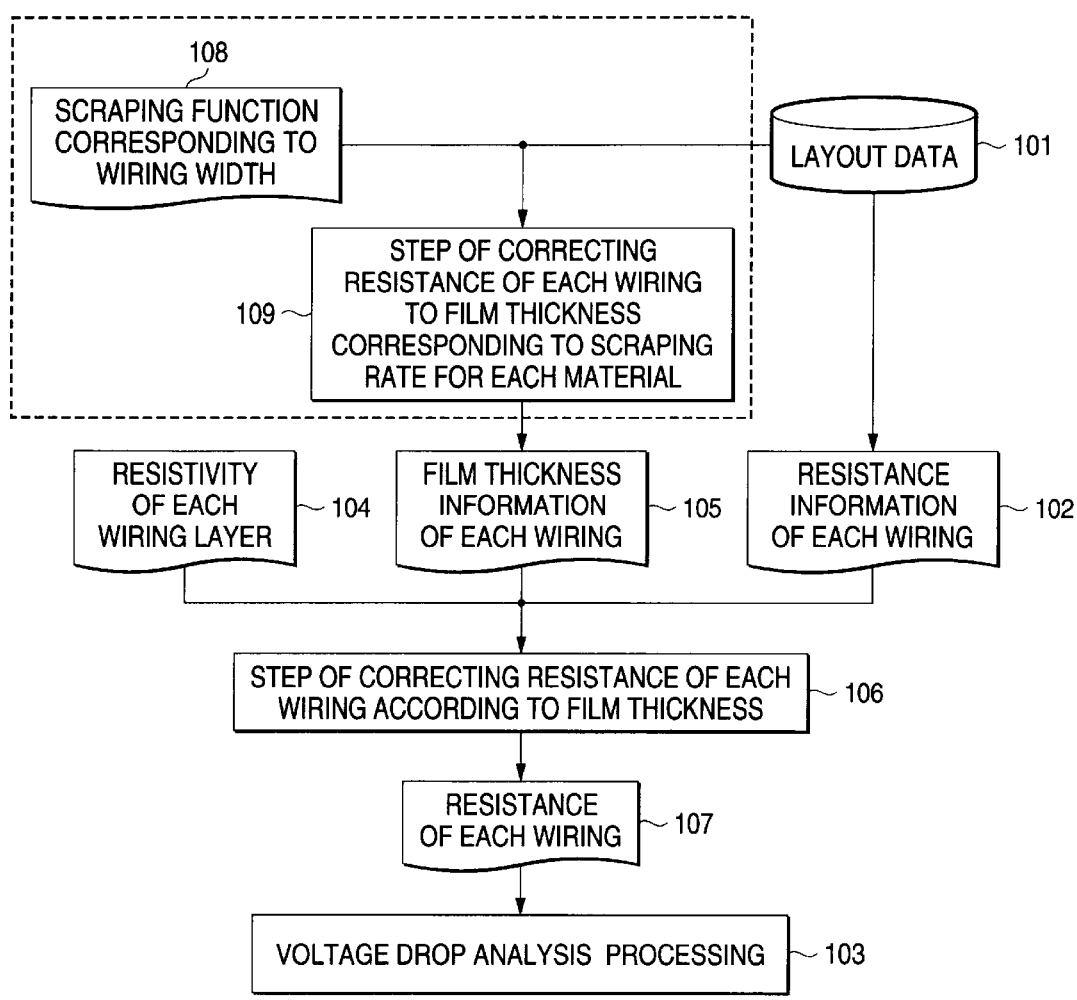
FIG. 2 is a implementing flowchart of a second embodiment of this invention.

FIG. 2 is a flowchart of correcting the wiring resistance according to the second embodiment of this invention. This flowchart relates to the case where the film thickness of each wiring in the above first embodiment varies not artificially but owing to a problem in a manufacturing process, for example, where the film thickness varies from that of the deposited film owing to scraping of the wiring layer by the CMP technique in the manufacturing process of LSI, or the film thickness of the laminated layer of the wiring material varies owing to the difference in the widths of the wirings. In FIG. 2, the same steps with those in FIG. 1 are given the same reference numerals. This embodiment is characterized in that the film thickness information computing step 105 is executed for each wiring via a scraping function 108 representative of the rate scraped according to the material and width of each wiring as a function of the wiring width, and step 109 of correcting the resistance based on the layout data 101 as designing information and the scraping function 105 acquired in the scraping function computing step.

For example, where the wiring layer is scraped by the CMP technique, the scraping function 108 is previously derived in the scraping function computing step 108 for the LSI manufactured experimentally in each manufacturing process and the scraping function is corrected in step 108 according to the layout data, thereby computing the film thickness of each wiring.

For example, assuming that the wiring layer is scraped as shown in FIG. 7, in the scraping function according to the wiring width, r is determined on the basis of Equation (1) as a constant for each material, i.e. $r=(W^2+4d^2)/8d$, and the wiring area is computed using the value of r on the basis of Equation (2).

$$r = \frac{W^2 + 4d^2}{8d} \qquad (1)$$

Scraped Area=

$$r^2 \sin^{-1}\frac{W}{2r} - \frac{W}{4}\sqrt{4r^2 - W^2} \qquad (2)$$

In the corrected film thickness computing step 105, the wiring area at the scraped region is subtracted from the normal film thickness to create the corrected film thickness information corresponding to the shaded portion in FIG. 7. Now, although the scraping of the wiring is taken as an example, also in the case where the technique of swelling the wiring layer is adopted, the corrected film thickness information can be created by defining a swelling function. By using the corrected film thickness thus obtained in the wiring resistance correcting step in the first embodiment, a change in the wiring film thickness due to the previously known problem on the manufacturing process is previously taken into consideration at the time of simulation so that the analysis with greater accuracy than in the conventional method can be carried out. Thus, a shortage in the voltage which will be first found on the real chip and timing violation can be reduced to improve the production yield.

Figure 3:
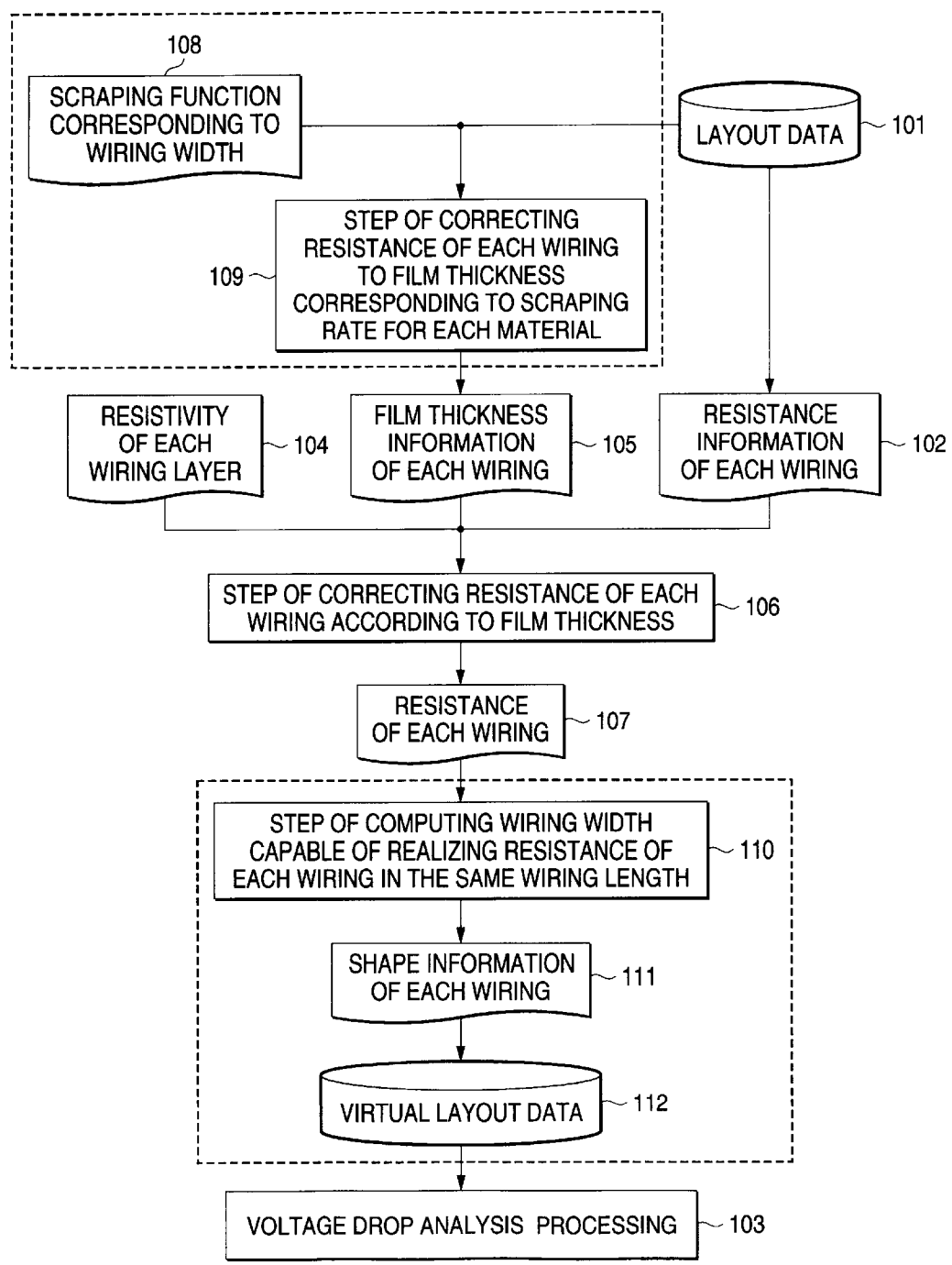
FIG. 3 is an implement flowchart of a third embodiment of this invention.

FIG. 3 is a flowchart of amending the wiring resistance according to the third embodiment of this invention. This embodiment is characterized by addition of processing of feedback to the layout data between the step of computing the resistance 107 of each wiring and voltage drop analysis processing 103.

In FIG. 3, like reference numerals refer to like steps in FIG. 2. In FIG. 3, this embodiment is characterized by a step of computing the wiring width on a normal sheet resistance so as to realize the corrected wiring resistance 107 in the same wiring length, a step of computing the wiring shape information for reflecting the virtual wiring width information acquired in the above wiring width computing step 110 on the layout data, and a virtual layout data computing step 112 of virtually reflecting the wiring shape information acquired in the wiring shape information computing step 111 on the layout.

Figure 8:
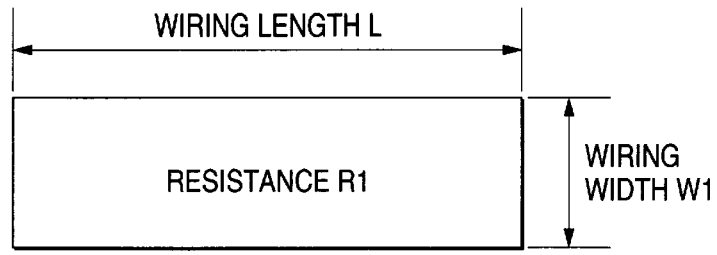
FIG. 8 is a view showing the surfaces before and after the wiring shape is modified according to the third embodiment.
Figure 8:
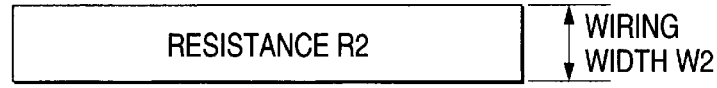

As seen from a surface view of the wiring shape in FIG. 8, (a) illustrates an original wiring shape, and (b) illustrates the corrected wiring shape computed by the virtual layout data computing step 112.

The designing flows until the step of computing the corrected wiring resistance according to the third embodiment is the same as that until the wiring resistance computing step 107 according to the first embodiment or the second embodiment. Thereafter, as described above, the wiring width capable of realizing the actually required resistance of each wiring in the same length of the wiring length of the original layout data is computed. For example, in the wiring width computing step 110, the length of each wiring and sheet resistance on the original layout data is divided by the resistance acquired in the step 107 of computing the resistance of each wiring, and shape information is produced from the step 111 of computing the wiring shape information so as to realize the sheet resistance required on the original layout data on an actual pattern of each wiring.

For example, it is assumed that there is an original wiring pattern as shown in FIG. 8(*a*) with a wiring length L, wiring width W1, resistance R1 and sheet resistance P. In this case, if the resistance becomes R2 in the step 107 of computing the resistance of each wiring in FIG. 3 as a result that the resistance is corrected taking a change in the film thickness and a warp in the wiring, the wiring width W2 can be computed from Equation W2=W1×R1/R2=(L×P)/R2, which results in a pattern as shown in FIG. 8(*b*).

Generally, if R1<R2, the wiring width must be revised small as shown in FIG. 8. In the step 111 of amending the wiring resistance, computing the wiring width after correction to compute the wiring shape information, the wiring shape information is acquired. The wiring shape information is read into the mask CAD tool to change the shape in the data base, thereby creating virtual layout data in the virtual layout data computing step 112 in FIG. 3.

The information acquired in the virtual layout data computing step 112 is used as an input to the voltage drop analysis processing 103. Thus, the voltage drop analysis processing system dependent on the layout data can be used.

Incidentally, the above process can be also adapted to the processing of executing the simulation using the wiring resistance such as timing analysis in place of the voltage drop analysis processing.

Figure 4:
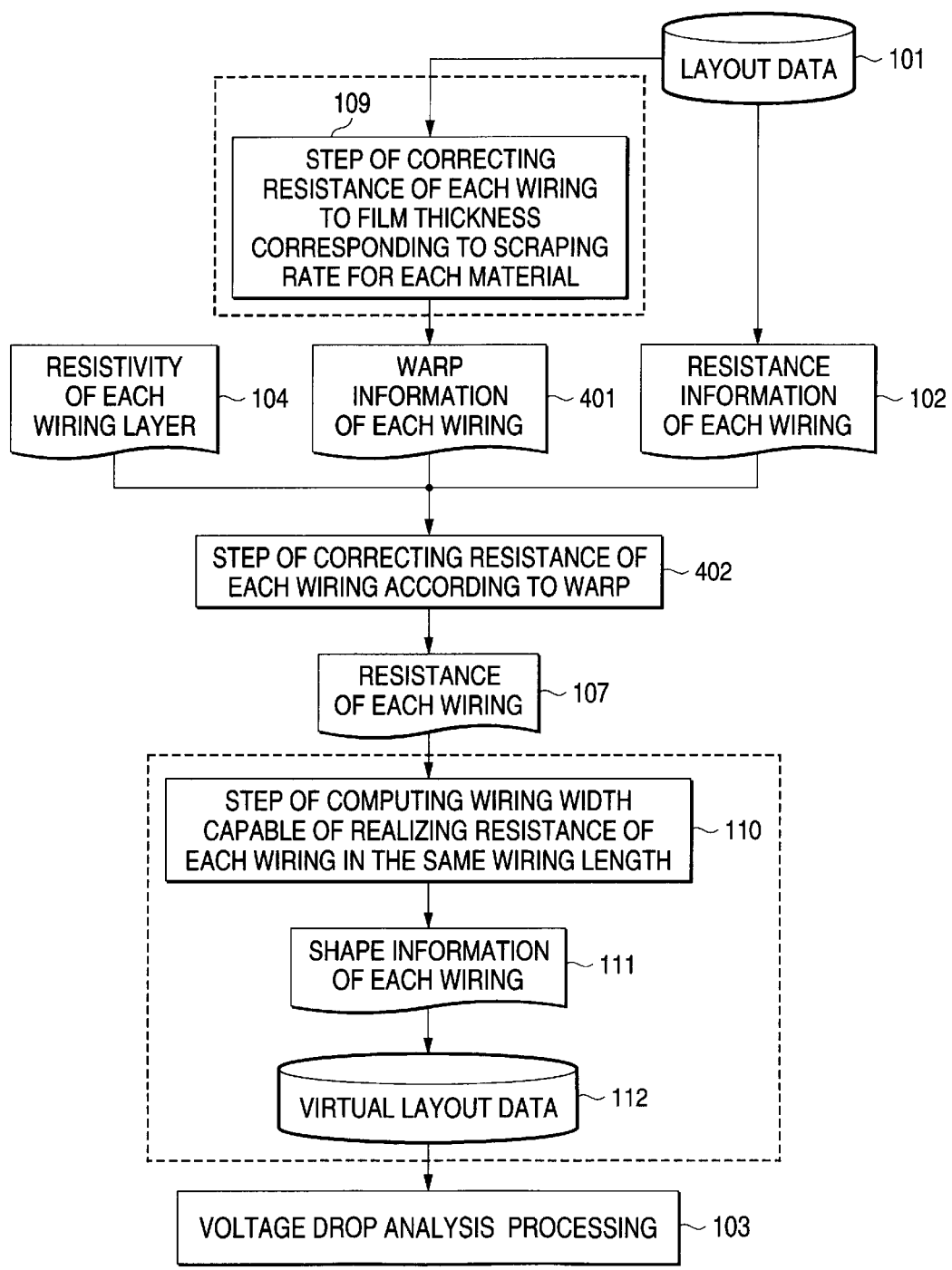
FIG. 4 is a flowchart for carrying out a fourth embodiment of this invention.
Figure 9:
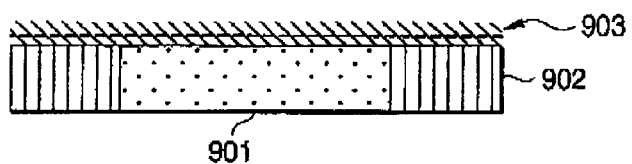
FIG. 9 is a sectional view showing the warp of a wiring according to the fourth embodiment.
Figure 9:
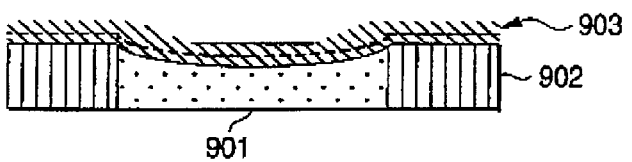
Figure 9:
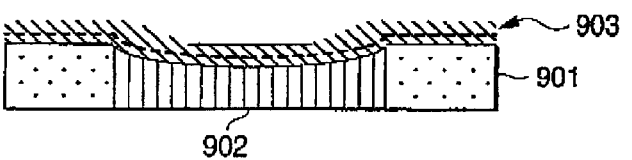
Figure 10:
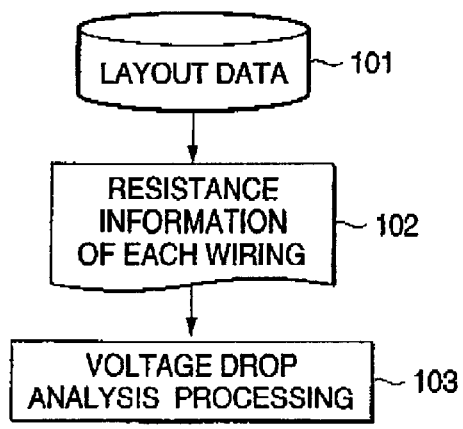
FIG. 10 is a flowchart of a prior art.

An explanation will be given of a wiring resistance revising step according to the fourth embodiment of this invention. FIG. 4 is a flowchart of revising the wiring resistance. FIG. 9 is a sectional view of the wiring shape. On the basis of the warp information due to the underlying wiring layer in a multiple wiring, this method according to this embodiment performs the same correction as that on the basis of the film thickness information.

As seen from FIG. 4, this embodiment is characterized by comprising a warp information computing step 401 of computing the warp information of an upper wiring layer corresponding to the film thickness information of each wiring and a step 402 of correcting the resistance on the basis of the warp information. Now, as shown in FIG. 9, it is assumed that a semiconductor device includes a lower layer wiring 901 formed on the surface era semiconductor substrate (not shown), an inter-wiring insulating film 902 formed thereon, and an upper layer wiring 903 fanned on the inter-wiring insulating film (902). An (inter-layer) insulating film between the lower layer wiring (901) and the upper layer wiring (903) is not shown. FIG. 9(*a*) shows the case where the lower layer wiring (901) and the insulating film (902) have been stacked horizontally. FIG. 9(*b*) shows the case where the lower layer wiring (901) has been scraped. FIG. 9(*c*) shows the case where the inter-wiring insulating film (902) of the lower layer has been scraped. A broken line indicates a thickness center of the upper layer wiring (903).

In the warp information computing step 401 shown in FIG. 4, the warp information of the upper layer wiring is created on the basis of the film thickness information of the lower layer acquired from the step 109 of computing the film thickness from the scraping rate in e.g. the third embodiment.

On the basis of the warp information, in step 402, the wiring resistance on the layout data is corrected.

For example, assuming that the resistance of the upper layer wiring over the width W1 of the lower layer wiring 901 is R1, the resistance R2 of the warped portion can be represented by Equation (2) using r in Equation (1).

$$R2 = \frac{R1 \times W1}{2r \sin^{-1} \frac{W1}{2r}} \quad (3)$$

By performing the processing such as the voltage drop analysis using the resistance thus corrected, an accurate analysis result can be obtained, thereby improving the yield in manufacturing an actual chip.

In the embodiments described above, a general wiring resistance correcting method has been explained. Specifically, as regards the wiring on the chip inclusive of the transistor formed on the silicon substrate, the correction of the wiring resistance has been performed as a general flow of processing. However, the resistance can be corrected, as occasion demands, considering a change in an environmental status such as the etching selectivity dependent on a region on the chip and extension of the wiring length due to the unevenness of a substrate surface.

If the polycide structure in which a wiring layer itself is composed of a plurality of layers, or respective wiring layers of a multi-layer wiring structure are subjected to the correction processing considering the structure of these wiring layers and an environmental status, more accurate resistance correction can be performed. Incidentally, the environmental status includes location dependency on a wafer in a film deposition or etching step, a change in the resistivity due to the reforming by heat treatment in the subsequent step, etc. Taking all these items of information into consideration, more accurate resistance correction can be realized.

In the embodiments described above, the resistance correction has been explained. The method according to this invention can be applied to capacitance correction. In this case, the correction will be preferably performed taking the inter-wiring distance in a three-dimensional space.

As described above, this invention comprises a step of subjecting the wiring resistance on an electronic data to correction for the portion undergoing a change on a real chip so that the accuracy of simulation using the wiring resistance can be improved to improve the yield.

What is claimed is:

1. A method of designing a semiconductor integrated circuit having a wiring on the surface of a semiconductor substrate, comprising:

a wiring resistance correcting step of correcting a resistance of said wiring according to film thickness information, wherein said film thickness information includes a predicted variation from a designed value of wiring film thickness.

2. The method according to claim 1, wherein said semiconductor substrate is a silicon wafer, and said wiring is a metallic wiring for connecting terminals of transistors arranged on the silicon wafer, said wiring resistance correcting step corrects the resistance of said metallic wiring according to the film thickness information.

3. The method according to claim 1, wherein said wiring resistance correcting step comprises the steps of:

computing a wiring width so that the resistance of said wiring becomes a specified resistance, and changing a layout data to provide the wiring width thus computed.

4. The method according to claim 1, wherein said wiring resistance correcting step comprises the steps:

computing a change in a wiring length of an upper layer on the basis of a stacking state of a lower layer in a multiple layer wiring for forming an LSI by stacking a wiring layer and an insulating film layer, and correcting the resistance into a resistance corresponding to the wiring length thus computed.

5. The method according to claim 1, wherein said film thickness information includes a designed value of the wiring film thickness.

6. The method according to claim 5, wherein said wiring resistance correcting step further comprises determining a corrected value of the wiring film thickness based on the predicted variation, and multiplying the value of said resistance with a ratio of the designed value of the wiring film thickness and the corrected value of the wiring film thickness.

7. The method according to claim 1, further comprising the step of analysis processing of the semiconductor integrated circuit based on the corrected resistance.

8. The method according to claim 7, wherein the step of analysis processing includes a voltage drop analysis.

9. A method of designing a semiconductor integrated circuit having a wiring on the surface of a semiconductor substrate, comprising:

a wiring resistance correcting step of correcting a resistance of said wiring according to film thickness information, wherein said wiring resistance correcting step comprises the steps of:

acquiring a varying function by computing a variation from a designed value of wiring film thickness in manufacturing an LSI;

computing a wiring film thickness on a real chip formed from said semiconductor substrate on the basis of said varying function; and correcting a layout data which is designed value information of the wiring film thickness on the basis of a difference between the designed value of the wiring film thickness and its value on the real chip.

* * * * *